United States Patent

[11] 3,593,204

[72] Inventor Daniel J. Healey, III
Baltimore, Md.

[21] Appl. No. 826,979
[22] Filed May 22, 1969
[45] Patented July 13, 1971
[73] Assignee Westinghouse Electric Corporation
Pittsburgh, Pa.

[54] HIGH FREQUENCY VOLTAGE CONTROLLED OSCILLATOR
10 Claims, 4 Drawing Figs.

[52] U.S. Cl. .......... 332/30 V, 331/23, 331/36 C, 331/138, 331/177 V, 332/19, 332/47
[51] Int. Cl. .......... H03c 3/22
[50] Field of Search .......... 332/30 V, 37, 38, 47, 19, 43 B; 331/18, 23, 138, 36 C, 177 V

[56] References Cited

UNITED STATES PATENTS

| | | | |
|---|---|---|---|
| 3,050,693 | 8/1962 | Sinninger | 332/30 (V) X |
| 3,375,469 | 3/1968 | Dawson | 332/30 (V) |
| 3,384,835 | 5/1968 | Racy | 332/30 (V) X |
| 3,270,297 | 8/1966 | Abe et al. | 332/30 (V) X |
| 3,407,363 | 10/1968 | Kaiser et al. | 331/177 (V) X |
| 3,409,845 | 11/1968 | Ogi et al. | 331/177 (V) X |

*Primary Examiner*—Alfred L. Brody
*Attorneys*—F. H. Henson, E. P. Klipfel and J. L. Wiegreffe

ABSTRACT: A high frequency voltage controlled oscillator incorporating a pair of varactor diodes in a bridge circuit forming the resonator section in a positive feedback circuit of a common base transistor oscillator.

INVENTOR
DANIEL J. HEALEY, III

BY Ernest P. Klipfel
ATTORNEY

HIGH FREQUENCY VOLTAGE CONTROLLED OSCILLATOR

BACKGROUND OF THE INVENTION

Various configurations of voltage controlled oscillators employing solid state components are well known to those skilled in the art. However, where voltage controlled oscillators are incorporated in phase lock servo loops to provide control over frequency modulation such as in a microwave frequency oscillator, the known prior art solid state voltage controlled oscillators, the known prior art solid state voltage controlled oscillators have proven to be inadequate. Prior art solid state voltage controlled oscillators have insufficient modulation bandwidth which results in lack of control of phase noise over the desired frequency band of operation. Phase noise degenerates the output of the microwave source.

The above mentioned related application discloses an extremely phase stable microwave source, wherein the microwave source output is extremely stable by virtue of the use of a fixed frequency microwave reference provided by a low level, low noise source. Under the influence of vibration, however, there will be a frequency modulation on the output of that microwave source. This frequency modulation must be eliminated. The elimination of this frequency modulation is achieved by causing a remotely generated extremely stable microwave signal to further control the output frequency of the microwave source above mentioned. This additional control is achieved by means of a HF/VHF solid state voltage controlled oscillator embodied in a phase lock servo loop. The HF/VHF solid state voltage controlled oscillator comprises the subject of the invention.

SUMMARY

The subject invention is directed to a voltage controlled oscillator operating preferably in the high frequency (HF) range for use in a phase lock loop for controlling the output frequency of a voltage tunable microwave source and comprises a common base transistor oscillator circuit including a zero phase shift feedback circuit coupled from the collector of the transistor back to the emitter. The feedback circuit comprises a resonator in the form of an inductance-capacitance bridge circuit wherein a pair of varactor diodes are respectively connected in adjacent branches of the bridge circuit.

DESCRIPTION OF THE PREFERRED EMBODIMENTS

Figure 1:
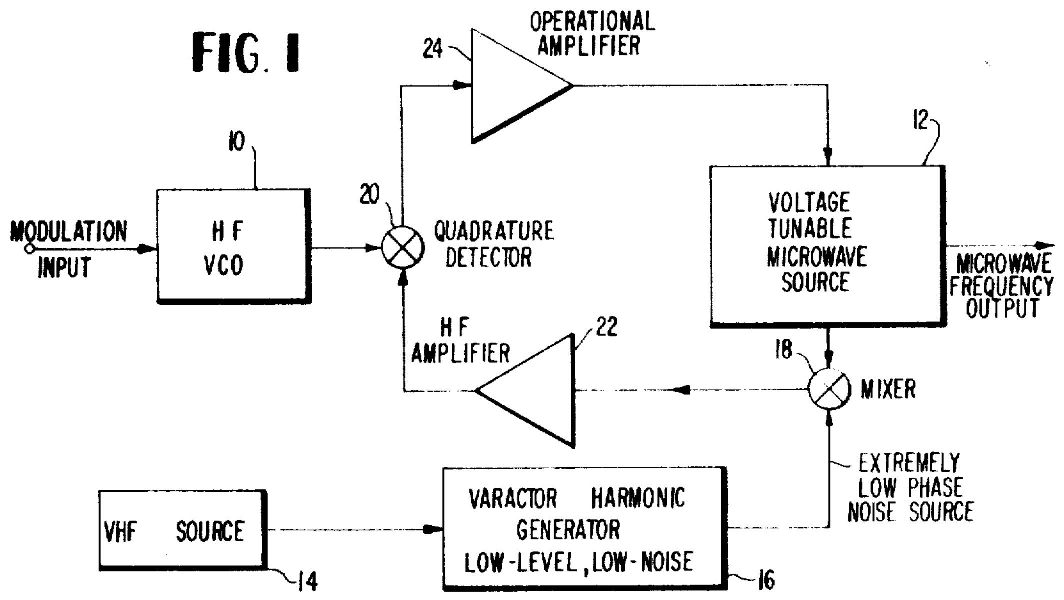
FIG. 1 is an electrical block diagram of a microwave frequency source incorporating a voltage controlled high frequency oscillator for a wide bandwidth phase locked loop for controlling the frequency of the microwave source.

In order to understand the operational environment of the subject invention ,it is helpful to refer to the block diagram shown in FIG. 1, wherein reference numeral 10 represents a high frequency (HF) voltage controlled oscillator, which is the subject of the present invention, being utilized for controlling the output frequency of a voltage tunable microwave source 12 in combination with a microwave reference signal source produced by a VHF source 14 coupled to a varactor harmonic generator 16. The reference frequency from the harmonic generator 16 and the output of the voltage controlled oscillator 10 are coupled into a phase lock loop by means of the mixer 18 and the quadrature detector 20. Additionally, a high frequency amplifier 22 is coupled from the output of the mixer 18 to one input of the quadrature detector 20. The output of the quadrature detector 20 is a DC voltage which is coupled to the voltage tunable microwave source 12 by means of an operational amplifier 24.

The operation of the circuit shown in FIG. 1 is such that a portion of the output of the microwave source 12 is mixed with the reference frequency from the harmonic generator 16 with the frequency difference therebetween comprising the output of the mixer 18. The output of the mixer 18 is fed to the quadrature detector 20, which additionally received an input from the voltage controlled oscillator 10 and provides a DC output for controlling the output frequency of the microwave source 12. The quadrature detector 20 effectively phase locks the output of the mixer 18 to the voltage controlled oscillator 10. The phase lock loop, moreover, has a bandwidth in excess of 1.0 MHz. for operation in the microwave frequency range. The configuration shown in FIG. 1 avoids the problems encountered with previous attempts to overcome inadequate loop bandwidth because of transport delays when the controlled variable is the VHF/oscillator 14 as well as the fact that larger instabilities are caused by the hostile environment where the oscillator 14 is made tunable. The embodiment shown in FIG. 1 is described in greater detail in the aforementioned cross referenced related application.

Figure 2:
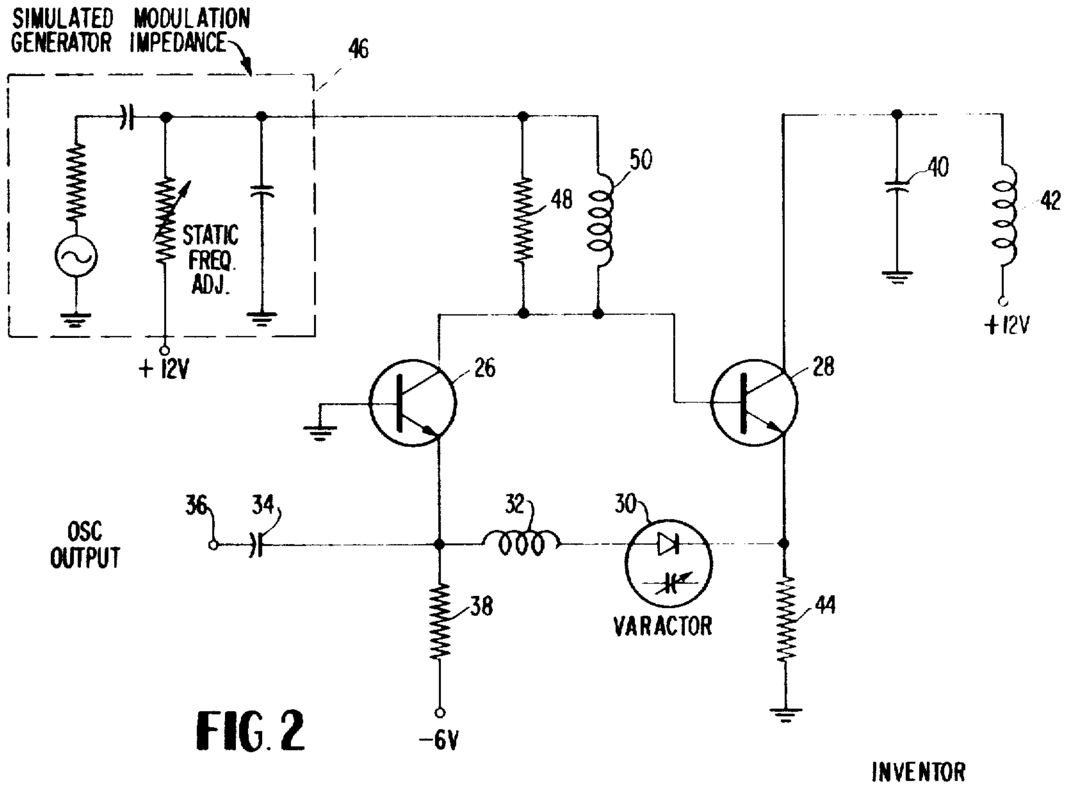
FIG. 2 is an electrical schematic diagram of an embodiment of a common base transistor oscillator circuit including a varactor diode in the feedback of the oscillator.

One embodiment of a high frequency voltage controlled oscillator, such as referred to by reference numeral 10 in FIG. 1 is shown in FIG. 2, wherein a transistor 26 is coupled in a common base configuration to a positive feedback circuit comprising a transistor emitter follower circuit including a second transistor 28 connected to the collector of transistor 26, and a varactor diode 30 and an inductance 32 coupled in series between the emitter of transistor 28 and the emitter of transistor 26. A varactor diode is a semiconductor device which operates as a voltage variable capacitor. Such devices are well known to those skilled in the art. A regenerative feedback circuit is thus established across the collector and emitter of transistor 26 due to the fact that zero phase shift exists therebetween as a result of the emitter follower circuit including the transistor 28 and the varactor diode 30 and the inductance 32 coupled thereto. The oscillator output is coupled from the emitter of transistor 26 by means of the coupling 34 and the output terminal 36. A resistor 38 is also coupled to the emitter of transistor 26 being adapted to couple a negative bias potential (−6*v*) thereto from a power supply source not shown . The emitter follower circuit, including transistor 28, additionally includes a by pass capacitor 40 and a choke coil 42 commonly coupled to the collector. The capacitor 40 is returned to ground while the coil 42 is coupled to a positive power supply potential (+12*v*) from a power supply not shown. The emitter of transistor 28 is returned to ground through the resistor 44. A modification signal source generally referred to by reference numeral 46 is coupled to the collector of transistor 26 by means of the parallel combination of resistor 48 and the inductance 50. The frequency of oscillation is determined primarily by the respective circuit values of the varactor diode 30 and the inductance 32; however, this frequency is adapted to be modified in accordance with the signal applied from the modulation source 46.

Figure 3:
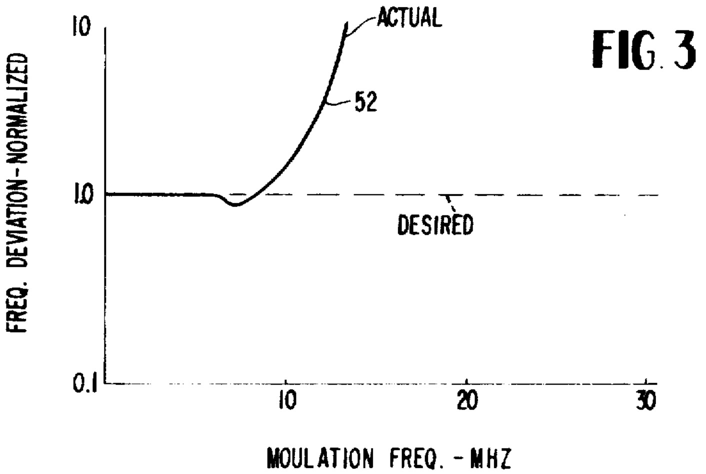
FIG. 3 is a diagram including a curve illustrative of the operation of the circuit shown in FIG. 2 utilized in the configuration shown in FIG. 1; and, FIG. 4 is an electrical schematic diagram illustrative of the preferred embodiment of the subject invention.

While the circuit shown in FIG. 2 is operable, difficulty arises where the frequency of operation is desired in the region beyond 10MHz. For example, by referring to FIG. 3, there is disclosed a curve 52, which is indicative of the normalized frequency deviation of the output frequency appearing at terminal 36 of FIG. 2 for a constant magnitude of modulation voltage applied to the collector of transistor 26 vs. the frequency of the modulation voltage. Curve 52 indicates that in the region of 10 MHz., the normalized frequency increase exponentially. This was found to be due to resonant condition occurring with respect to the varactor diode 30 in combination with the inductor 32. However, what is desired is a constant frequency deviation for a selected value of modulation voltage over the frequency range of 0—30 MHz.

Figure 4:
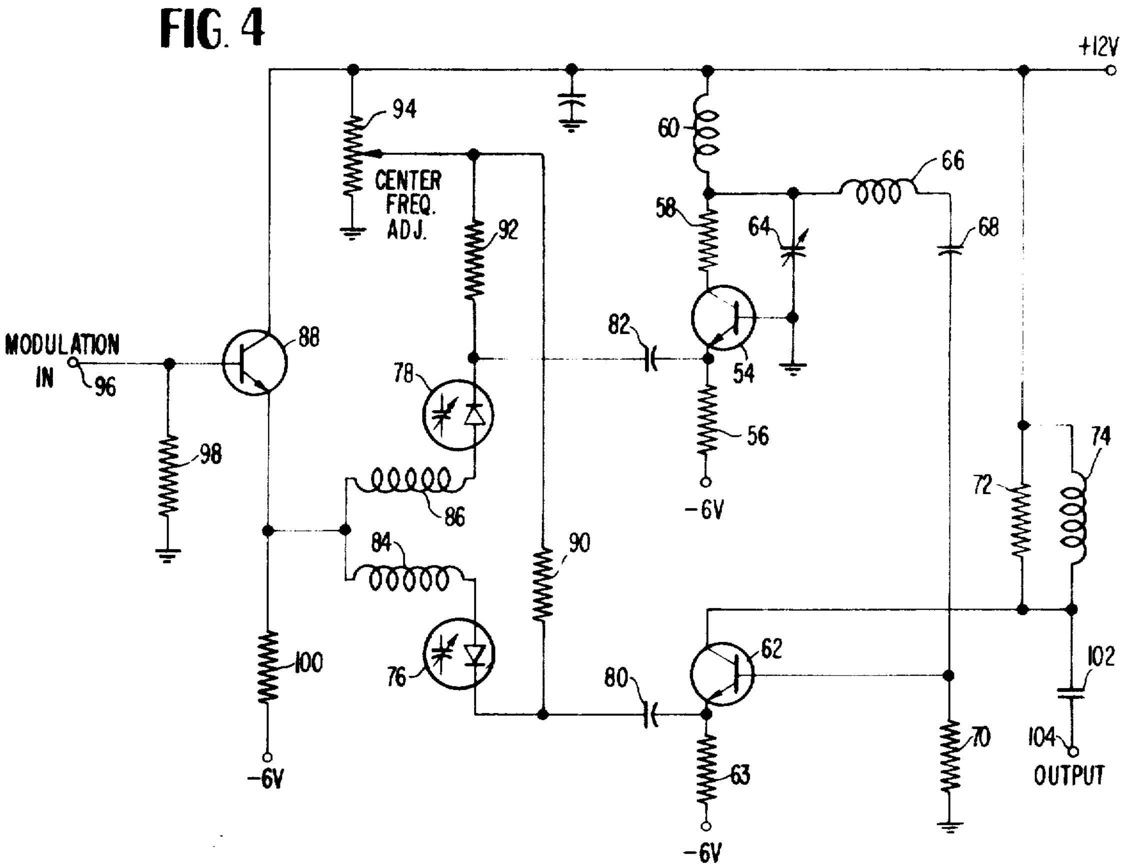

Such a circuit, however, is realized with the preferred embodiment of the invention as shown with respect to FIG. 4. Directing attention now to the schematic diagram of the preferred embodiment of the subject invention, there is disclosed a common base transistor feedback oscillator wherein the feedback circuit includes a bridge circuit including a pair of varactor diodes and a pair of inductances forming the branches or legs of the bridge. More particularly, the circuit comprises a first transistor 54 connected in a grounded base configuration. The base is directly coupled to ground while the emitter is coupled to a source of negative supply potential (−6*v*) by means of the resistor 56 and the collector is coupled to a positive supply source (+12*v*) by means of the series combination of resistor 58 and the choke 60. The collector of transistor 54 is coupled to the base of an emitter follower transistor 62 by means of a band pass filter comprised o the variable capacitor 64, the inductance 66 and the fixed capacitor 68. The base of transistor 62 is additionally returned to ground by means of the resistor 70. The collector of transistor 62 is coupled to the positive supply potential (+12*v*) by means of the resistor 72 and the choke coil 74.

Since an emitter follower does not invert the signal applied to its input, the emitter of transistor 62 provides a signal which is in phase with the signal appearing at the collector of transistor 54. A positive feedback circuit is coupled from the emitter of transistor 62 to the emitter of transistor 54 including the pair of varactor diodes 76 and 78 respectively coupled to the emitters of transistors 62 and 54 by means of the capacitors 80 and 82. The opposite ends of the varactor diodes 76 and 78 are coupled to a pair of inductances 84 and 86 which are commonly connected to the emitter of a third transistor 88. The combination of the inductors 84 and 86 and the varactor diodes 76 and 78 comprise an L–C bridge circuit with the varactors being coupled together through the capacitors 80 and 82 and the resistors 56 and 63. The varactor diodes additionally include means for having a DC bias voltage applied thereto by means of the resistors 90 and 92 commonly connected to the slider of a potentiometer 94 which is coupled between the positive supply potential (+12*v*) and ground. Completing the circuit, a modulation signal is adapted to be applied to the varactor diodes 76 and 78 through the transistor 88 and the inductors 84 and 86. The modulation input voltage is applied to the terminal 96 across the base resistor 98 of transistor 88. The load resistor for the emitter follower circuit including transistor 88 comprises the resistor 100 coupled to the negative supply potential (−6*v*). The modulation signal applied to the varactor diodes appears across the resistor 100.

In operation, adjustment of the potentiometer 94 establishes a selected value of capacitance for the varactor diodes 76 and 78, which in combination with the inductors 84 and 86 establish a resonator circuit a series resonant circuit of a predetermined center frequency of operation. As noted earlier, the resonator circuit is coupled in a positive feedback circuit feedback through the emitter follower comprising transistor 62 across the emitter and collector of the grounded base transistor 54. An oscillator circuit results which is capable of operating in the frequency range of at least 10—30 MHz. as required for operation in the circuit shown in FIG. 1. The oscillator output is taken from the collector of transistor 62 by means of the coupling capacitor 102 and the terminal 104. The output terminal 104 would be coupled to the quadrature detector 20 in FIG. 1.

What has been shown and described therefore is a high frequency, solid-state feedback oscillator adapted for operation in the range of 10—30 MHz. due to the inclusion of a resonator circuit comprising a bridge circuit having a pair of varactor semiconductor diodes comprising adjacent branches of the bridge. Such a circuit has resulted in two attendant advantages. First, the use of bridge circuitry makes modulating signal frequencies and oscillator carrier plus side band frequencies orthogonal so that the transfer function obeys the characteristic desired and does not peak. Secondly, the varactor diodes do not introduce an intermodulation of second harmonic noise.

While the present invention has been shown and described with what is at present considered to be the preferred embodiment thereof, modification thereto will readily occur to those skilled in the art. It is not desired, therefore, that the invention be limited to the specific arrangement shown and described, but it is to be understood that all equivalents, alterations, and modifications coming within the spirit and scope of the invention are herein made to be included.

I claim:

1. A voltage tunable oscillator circuit comprising in combination a signal translation device having an input and an output terminal and including means for rendering said signal translation device operable as an amplifier;

a positive feedback circuit coupled between said input and output terminals, having a loop gain sufficient for establishing an oscillatory mode of operation, and including a bridge resonator circuit comprising a first and a second voltage variable capacitor coupled in adjacent branches of said bridge resonator circuit, and a first and a second inductance coupled respectively to one end of said first and second voltage variable capacitor forming opposite adjacent legs of said bridge resonator circuit thereby and having a common connection therebetween, said first and second voltage variable capacitors and said first and second inductances forming a series resonant circuit between said input and output terminals;

and bias voltage circuit means coupled to said first and second voltage variable capacitor for applying a predetermined voltage thereto for selectively setting the capacitance values thereto for operating said resonator circuit at a predetermined frequency and thereby establishing the output frequency of said voltage tunable oscillator circuit.

2. The invention as defined by claim 1 wherein said signal translation device comprises a first transistor having a base, an emitter and a collector and wherein said transistor is operated in a common base circuit configuration including circuit means for coupling said base to a point of reference potential, and said input and output terminals respectively comprise said emitter and collector.

3. The invention ad defined by claim 2 wherein said feedback circuit additionally includes band pass filter means coupled between said collector and said bridge resonator circuit.

4. The invention as defined by claim 2 wherein said positive feedback circuit additionally includes circuit means for coupling said voltage second voltage variable capacitor to the emitter of said first transistor.

5. The invention as defined by claim 1 wherein said first and second voltage variable capacitors each comprise a semiconductor varactor diode and additionally including circuit means coupled to said first and second varactor diode for applying a modulation signal thereto for varying the capacitance values thereof.

6. The invention as defined by claim 5 wherein said last mentioned circuit means comprises a second signal translation device coupled to the common connection of said first and second inductance.

7. The invention as defined by claim 6 wherein said signal translation device comprises a transistor having a base, an emitter, and a collector and including circuit means for coupling said modulation signal to said base and circuit means for coupling said emitter to the common connection between said first and second inductance.

8. The invention as defined by claim 2 wherein said feedback circuit additionally includes an emitter follower circuit operably coupled between said first transistor and said series resonant circuit, said emitter follower circuit including a second transistor having a base, an emitter, and a collector.

9. The invention as defined by claim 8 including a third transistor coupled to said bridge resonator circuit for applying a modulation signal therethrough for varying the capacitance values of said voltage variable capacitors.

10. The invention as defined by claim 9 wherein said third transistor is coupled to the common connection of said first and second inductance.